(12) United States Patent
Lee

(10) Patent No.: US 8,309,463 B2
(45) Date of Patent: Nov. 13, 2012

(54) METHOD FOR FORMING FINE PATTERN IN SEMICONDUCTOR DEVICE

(75) Inventor: Byoung Hoon Lee, Daejeon (KR)

(73) Assignee: Hynix Semiconductor Inc., Icheon (KR)

( * ) Notice: Subject to any disclaimer, the term of this patent is extended or adjusted under 35 U.S.C. 154(b) by 367 days.

(21) Appl. No.: 12/650,184

(22) Filed: Dec. 30, 2009

(65) Prior Publication Data
US 2011/0124196 A1 May 26, 2011

(30) Foreign Application Priority Data

Nov. 20, 2009 (KR) .................. 10-2009-0112535

(51) Int. Cl.
*H01L 21/44* (2006.01)
(52) U.S. Cl. ............. 438/675; 438/700; 216/66; 216/67
(58) Field of Classification Search .................. None
See application file for complete search history.

(56) References Cited

U.S. PATENT DOCUMENTS

| 6,716,570 B2 * | 4/2004 | Nagarajan et al. ............ 430/311 |
| 2007/0049040 A1 * | 3/2007 | Bai et al. ........................ 438/712 |
| 2008/0076070 A1 * | 3/2008 | Koh et al. ..................... 430/311 |
| 2010/0330806 A1 * | 12/2010 | Wang et al. ................... 438/675 |

FOREIGN PATENT DOCUMENTS

| KR | 10-2008-0064033 A | 7/2008 |
| KR | 10-2008-0095602 A | 10/2008 |
| KR | 10-2009-0011901 A | 2/2009 |
| KR | 10-2009-0116360 A | 11/2009 |

* cited by examiner

*Primary Examiner* — Duy Deo

(57) ABSTRACT

A method for forming a contact hole of a semiconductor device according to the present invention forms a contact hole which is defined as a new contact hole region (a second contact hole region), between spacers as well as a contact hole defined within the spacer (a first contact hole region) by a spacer patterning technology (SPT). The present invention with this method can help to form a fine contact hole as a double patterning is used, even with one mask.

17 Claims, 6 Drawing Sheets

(a)

(b)

(a)

(b)

(a)

(b)

(a)

(b)

(a)

(b)

(a)

(b)

(a)

(b)

METHOD FOR FORMING FINE PATTERN IN SEMICONDUCTOR DEVICE

CROSS-REFERENCE TO RELATED APPLICATION

The present application claims priority to Korean patent application number 10-2009-0112535 filed on Nov. 20, 2009, which is incorporated by reference in its entirety.

BACKGROUND OF THE INVENTION

The present invention relates to a method for forming a contact hole of a semiconductor device. More particularly, the present invention relates to a method for forming a contact hole using a spacer patterning technology (SPT).

Recently, as semiconductor devices become smaller and highly integrated, the whole chip area is increased in proportion to an increase in memory capacity. However, an area of a cell region in the semiconductor device, which contains patterns, is practically decreased.

Thus, in order to form a large number of patterns in a limited cell region, a pitch size of patterns, for example, a critical dimension (CD) of a pattern or distance between two adjacent patterns becomes reduced.

In addition, such fine patterns are formed via a photolithography process.

In the photolithography process, a photoresist film is coated over a substrate. An exposure process is performed on the photoresist film with an exposure mask where fine patterns are defined, by a laser light source, e.g., i-line (365 nm), KrF (248 nm), ArF (193 nm) or F2 (153 nm). A development process is then carried out to form a photoresist film pattern.

However, as a design rule of semiconductor devices is decreased, the pitch size of patterns which is realized in the semiconductor devices becomes reduced. Since the maximum resolution of a photolithography apparatus is preset, it is difficult to form patterns that are finer than the maximum resolution of the apparatus. In particularly, in order to form patterns having a pitch finer than the maximum resolution, a masking process is performed a plurality of times. This process complicates the overall process for forming a fine pattern. For example, each time a masking process is performed, there is a chance that a misalignment could occur so a repeated masking process correspondingly increases the likelihood of misalignment. A repeated masking process also raises the chance of a semiconductor device being contaminated due to contact with a mask.

Accordingly, there is a demand for a method for forming a fine pattern such as a contact hole with simplified process steps.

BRIEF SUMMARY OF THE INVENTION

The present invention is directed to provide a novel method for finely forming a contact hole with simplified process steps.

A method for forming a contact hole of a semiconductor device according to an embodiment of the present invention comprises: forming a mask layer over a target etching layer, forming a photoresist film pattern over the mask layer, forming a spacer on a sidewall of the photoresist film pattern, removing the photoresist film pattern, etching the mask layer using the spacer as an etch mask to form a mask pattern, etching the target etching layer using the mask pattern as an etch mask to form a target contact hole.

In the present invention, a spacer patterning technology (SPT) is used to form a contact hole which is defined as a region between spacers as well as a region within the spacer. With this method, the present invention can form a fine contact hole as a double patterning is used, even with one mask.

In the method of the present invention, the photoresist film pattern has a pillar shape.

In the method of the present invention, the step of forming the photoresist pattern comprises forming a photoresist film over the mask layer, etching the photoresist film to form a first pillar pattern, the first pillar pattern having a critical dimension (CD) larger than a target CD, and trimming the first pillar pattern to reduce the CD of the first pillar pattern to the target CD.

In the present invention, the pillar pattern is formed through a single patterning process using a single exposure mask or a double exposure process using a line/space mask.

The method of the present invention can further comprise forming a bottom anti reflection coating (BARC) under the photoresist film pattern.

In the method of the present invention, the second step is performed such that adjacent spacers come in contact with each other in a first direction and a second direction perpendicular to the first direction, and the adjacent spacers are separated from each other in a diagonal direction between the first direction and the second direction to expose the hard mask layer.

In the method of the present invention, the spacer can be formed with an atomic layer deposition (ALD) process. In addition, the ALD process can be performed at a low temperature ranging from 0 to 200° C. Further, the spacer can be made of a nitride film, an oxide film or a combination thereof.

In the method of the present invention, the hard mask layer is formed with a stacking structure of an amorphous carbon layer and a silicon oxynitride film.

BRIEF DESCRIPTION OF THE DRAWINGS

FIGS. 1a through 6a are top views illustrating a method of forming a contact hole in accordance with the present invention.

FIGS. 1b through 6b are cross-sectional views of respective FIGS. 1a through 6a, taken along the line A-A' of FIG. 1a.

DESCRIPTION OF EMBODIMENTS

FIGS. 1 through 6 are views illustrating a method for forming a contact hole according to the present invention. FIGS. 1(a) through 6(a) are top views of FIGS. 1 through 6, and FIGS. 1(b) through 6(b) are cross-sectional views taken along the line A-A' of FIG. 1.

Figure 1:
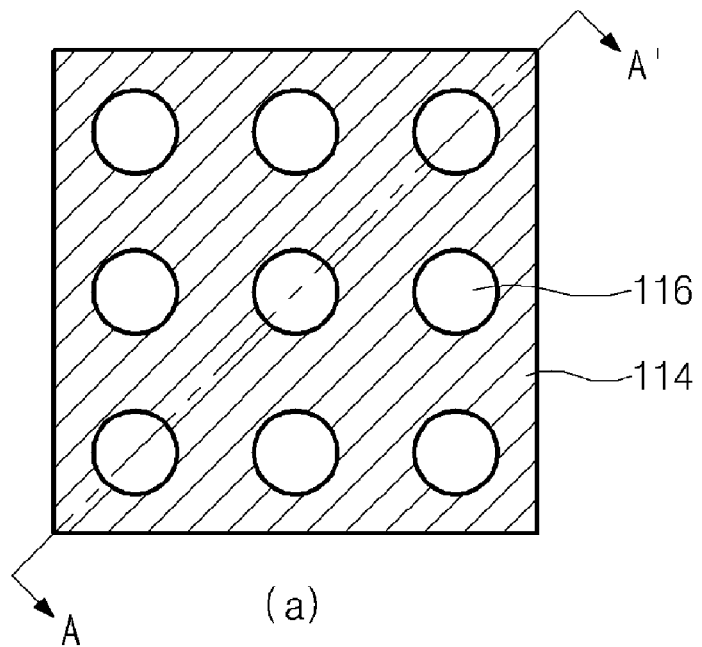
Figure 1:
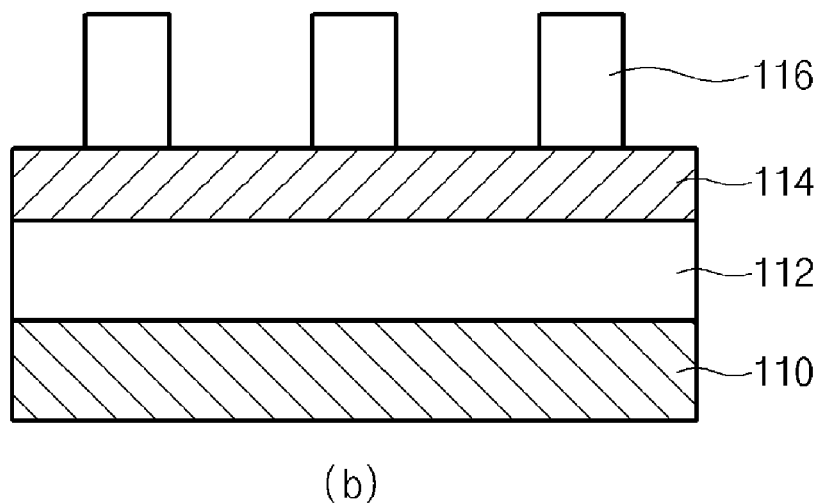

First, referring to FIG. 1, a target etching layer (for example, an interlayer insulating film) 112, a hard mask layer 114 and a photoresist film (not shown) are formed over a semiconductor substrate. Next, a pillar patterning process is performed with a photolithography process using an exposure maskdefining a first contact hole region to form a photoresist film pattern 116. That is, the photoresist film pattern 116 includes pillar patterns formed in a pillar shape over the first contact hole region. The pillar pattern can be formed with a single patterning process using a single exposure mask or a double exposure process using line/space masks.

In addition, if a critical dimension (CD) of the pillar is too small, the pillar may collapse during the pillar pattern formation. Thus, in order to prevent this, the pillar pattern is formed having a CD larger than a target CD, and then the pillar pattern having the target CD may be formed by reducing the CD with a trimming process.

The hard mask layer 114 can be formed with a stack structure of an amorphous carbon layer and a silicon oxynitride film. In addition, a bottom anti-reflection coating (BARC) can be formed under the photoresist film (not shown).

Figure 2:
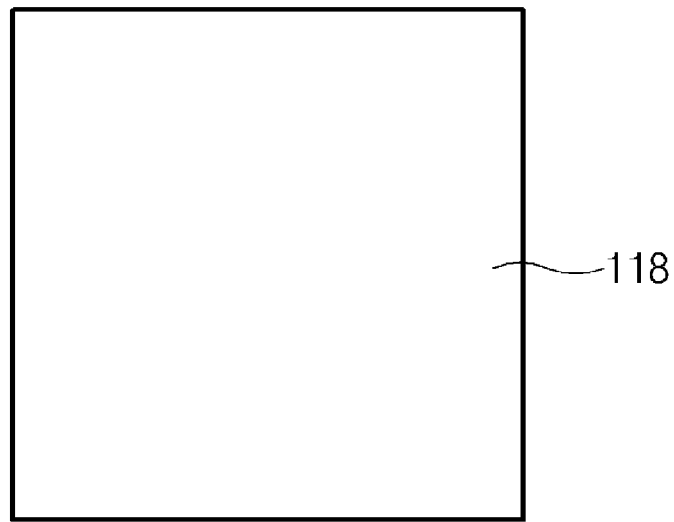
Figure 2:
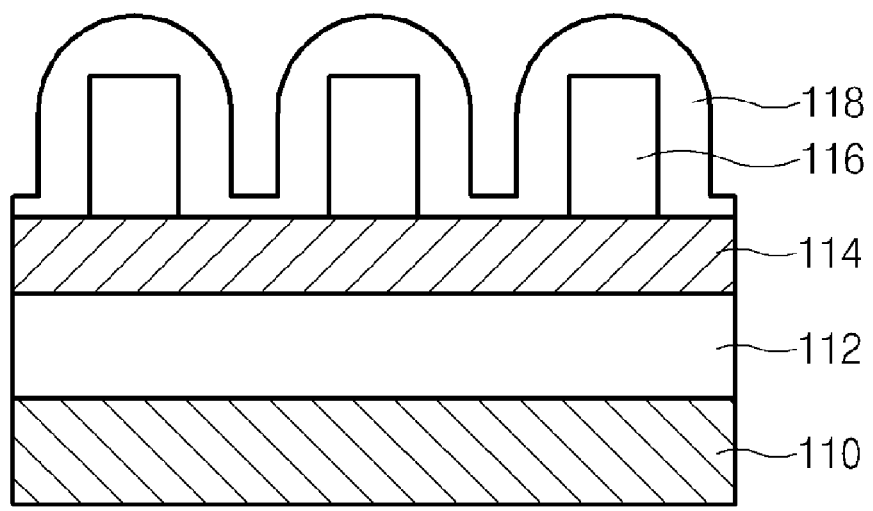

Next, referring to FIG. 2, a spacer layer 118 is formed on the entire surface including the photoresist film pattern 116, e.g., by using an atomic layer deposition (ALD) process. The ALD process is preferably formed at a low temperature not more than 200° C. The spacer layer 118 can be formed of a nitride film, an oxide film or a combination thereof.

If the BARC is formed under the photoresist film, the BARC can be first etched using the photoresist film pattern 116 before forming the spacer layer 118.

Figure 3:
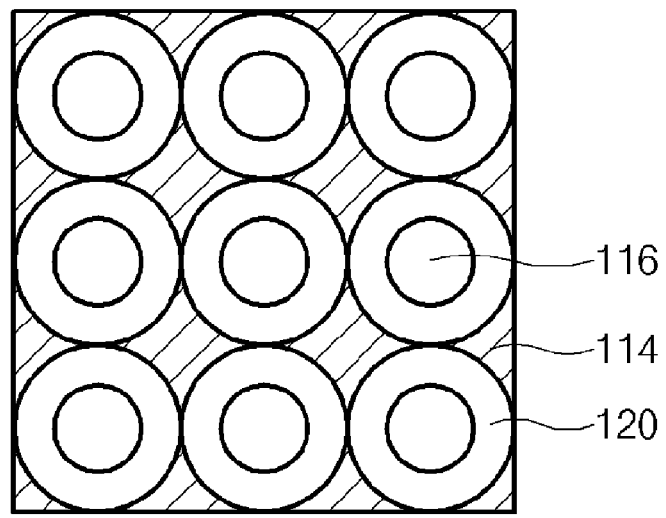
Figure 3:
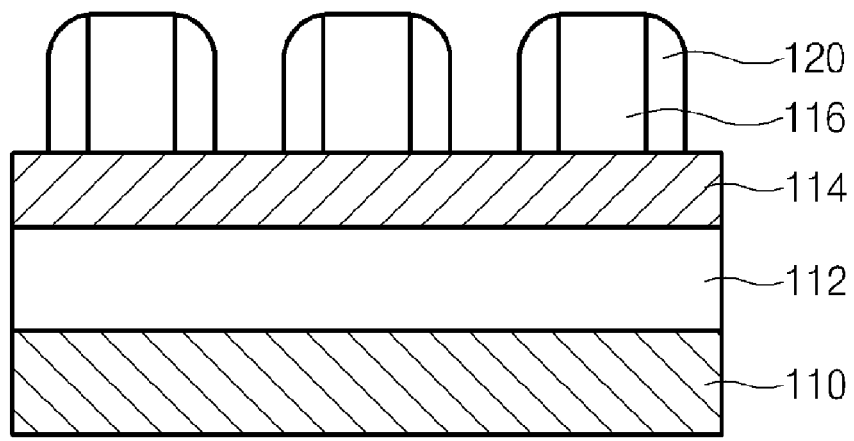

Referring to FIG. 3, an etch back process is performed until the photoresist film pattern 116 is exposed, to form a spacer 120 on a sidewall of the photoresist film pattern 116. The spacer 120, as FIG. 3(a), is formed in a ring shape and arranged such that the neighboring spacers 120 come in contact with each other in X-axis and Y-axis directions, and the neighboring spacers 120 are separated from each other with a given interval. That is, since the distance between the adjacent spacers 120 in the diagonal direction is greater than that in the X- and Y-axis directions, the spacers 120 in the X- and Y-axis directions come in contact with each other while the spacers 120 in the diagonal direction do not come in contact with each other. The given interval between the spacers 120 in the diagonal direction is preferably adjusted to be substantially the same as the inner diameter of the doughnut-type spacer 120.

Figure 4:
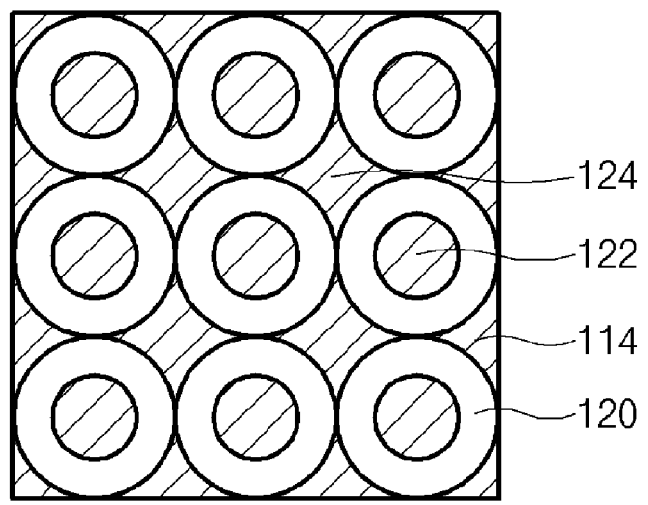
Figure 4:
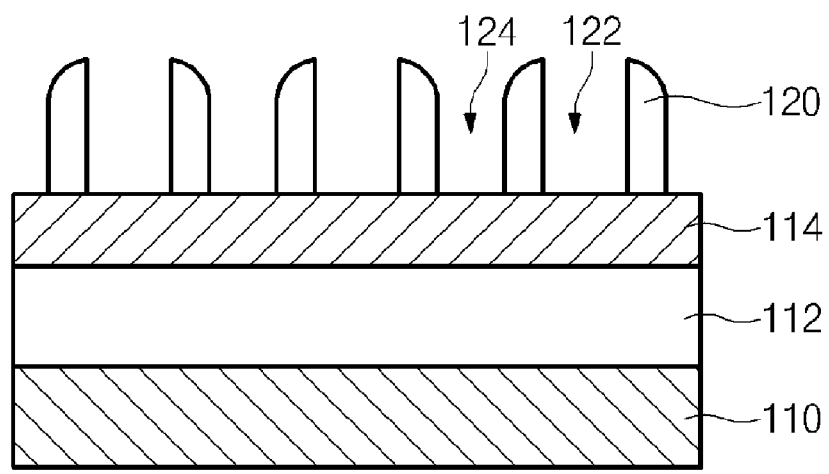

Referring to FIG. 4, a photoresist strip process is performed to remove the photoresist film pattern 116.

Thus, if the photoresist film pattern 116 is removed, a hole region (a second contact hole region) 124 is formed surrounding the adjacent spacers 120 while the hard mask layer 114 is exposed in a region between the adjacent spacers 120 in a diagonal direction as well as the first contact hole region 122 where the photoresist film pattern 116 was formed.

In the present invention, the first contact hole region 122 and the second contact hole region 124 surrounded by 4 adjacent spacers 120 become a target contact hole region to be finally formed.

Figure 5:
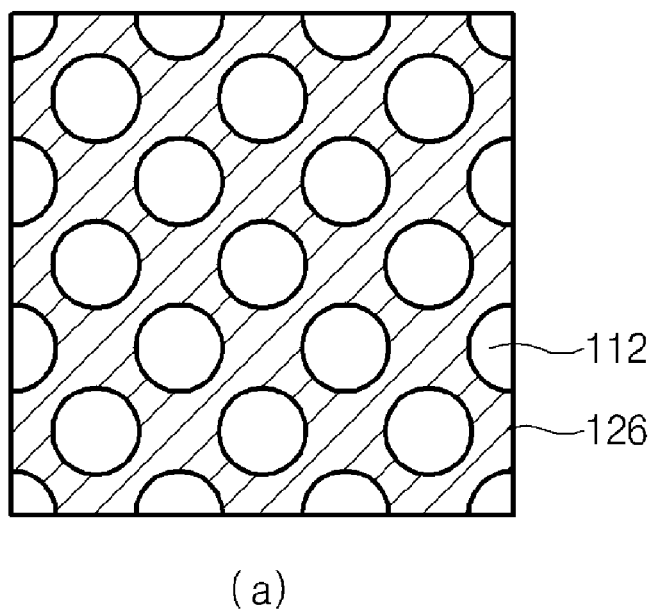
Figure 5:
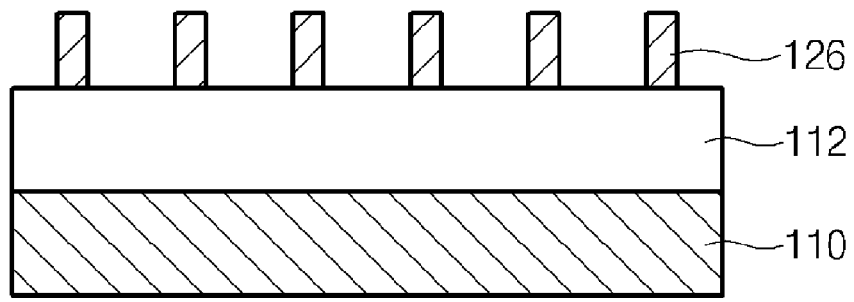

Referring to FIG. 5, the hard mask layer 114 is etched until the target etching layer 112 is exposed using the spacer 120 as an etching mask. Then, the spacer 120 is removed. As a result, a hard mask layer pattern 126 defining a target contact hole region is formed.

Figure 6:
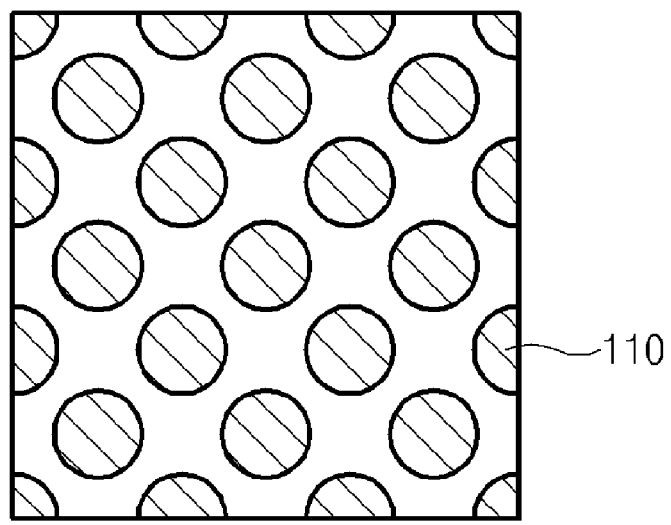
Figure 6:
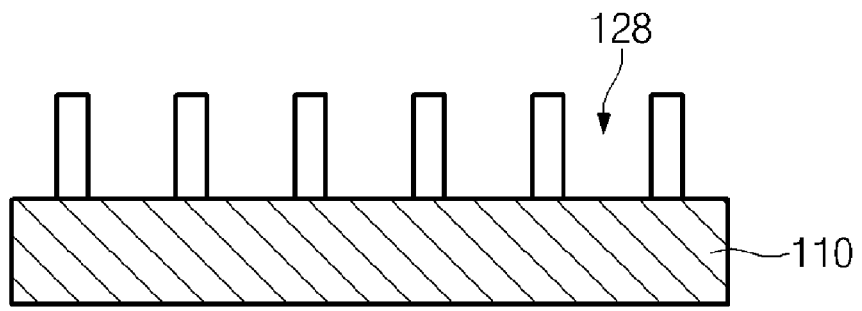

Referring to FIG. 6, a target contact holes 128 are formed by etching the target etching layer 112 with the hard mask layer pattern 126 as an etching mask. The target contact holes are formed to have substantially the same size. That is, the size of a contact hole formed in the first contact hole region 122 and the size of a contact hole formed in the second contact hole region 124 are the same since the neighboring spacers 120 were arranged in a diagonal direction at the same interval.

According to the present invention, a fine pattern can be formed by forming a contact hole using a SPT process with more simplified process steps.

The above-described embodiments of the present application are intended to be examples only. Alterations, modifications, substitutions and additions may be effected to the particular embodiments by those skilled in the art without departing from the spirit and scope of the application, which is defined by the claims appended hereto. Such alterations or modifications are intended to fall within the scope of the appended claims.

For example, in the embodiment as described above, although the shape of a contact hole region to be formed is circular, the shape can be polygonal such as rectangular or the like.

What is claimed is:

1. A method for forming a contact hole of a semiconductor device, the method comprising:
   forming a mask layer over a target etching layer;
   forming a photoresist film pattern over the mask layer;
   forming a plurality of spacers on sidewalls of the photoresist film pattern, each spacer having a ring shape;
   removing the photoresist film pattern;
   etching the mask layer using the spacer as an etch mask to form a mask pattern; and
   etching the target etching layer using the mask pattern as an etch mask to form a target contact hole,
   wherein adjacent spacers contact each other in a first direction and a second direction perpendicular to the first direction, and the adjacent spacers are separated from each other by a designated distance in a diagonal direction between the first direction and the second direction.

2. The method of claim 1, wherein the photoresist film pattern has a pillar shape.

3. The method of claim 2, wherein the photoresist film pattern is formed through a single patterning process or a double exposure process.

4. The method of claim 2, wherein the forming the photoresist film pattern comprises:
   forming a photoresist film over the mask layer;
   etching the photoresist film to form a first pillar pattern, the first pillar pattern having a critical dimension (CD) larger than a target CD; and
   trimming the first pillar pattern to reduce the CD of the first pillar pattern to the target CD.

5. The method of claim 4, wherein the first pillar pattern is formed through a single patterning process or a double exposure process.

6. The method of claim 1, wherein the target contact hole includes a first contact hole region within the spacer and a second contact hole region between spacers.

7. The method of claim 1, wherein the spacer is formed with an atomic layer deposition (ALD) process.

8. The method of claim 7, wherein the ALD process is performed at a low temperature ranging from 0 to 200° C.

9. The method of claim 1, wherein the spacers comprise a nitride film, an oxide film or a combination thereof.

10. The method of claim 1, wherein the mask layer is formed with a stacking structure of an amorphous carbon layer and a silicon oxynitride film.

11. The method of claim 1, wherein the designated distance between spacers is substantially uniform.

12. The method of claim 1, further comprising forming a bottom anti reflection coating (BARC) under the photoresist film pattern.

13. A method for forming a contact hole of a semiconductor device, the method comprising:
   providing a substrate having a mask layer over a target etching layer;
   forming a photoresist pattern over the mask layer, the photoresist pattern having a first width;
   trimming the photoresist pattern to have a second width that is smaller than the first width;

forming a plurality of spacers on sidewalls of the photoresist pattern having the second width, each spacer having a ring shape;

removing the photoresist film pattern;

etching the mask layer using the spacer as an etch mask to form a mask pattern; and etching the target etching layer using the mask pattern as an etch mask to form a target contact hole, wherein adjacent spacers contact each other in a first direction and a second direction perpendicular to the first direction, and the adjacent spacers are separated from each other by a designated distance in a diagonal direction between the first direction and the second direction.

14. The method of claim 13, wherein the plurality of spacers are formed around the photoresist pattern having the second width.

15. The method of claim 13, wherein the target contact hole includes a first contact hole region in an inner portion of the ring shape of the spacer and a second contact hole region between spacers.

16. A method for forming a contact hole of a semiconductor device, the method comprising:

forming a mask layer over a target etching layer;

forming a photoresist film pattern over the mask layer;

forming a plurality of spacers on sidewalls of the photoresist film pattern, each spacer having a ring shape;

removing the photoresist film pattern;

etching the mask layer using the spacer as an etch mask to form a mask pattern; and etching the target etching layer using the mask pattern as an etch mask to form a target contact hole, wherein adjacent spacers contact each other in a first direction and a second direction perpendicular to the first direction, and the adjacent spacers are separated from each other by a designated distance in a third direction between the first direction and the second direction.

17. A method for forming a contact hole of a semiconductor device, the method comprising:

providing a substrate having a mask layer over a target etching layer;

forming a photoresist pattern over the mask layer, the photoresist pattern having a first width;

trimming the photoresist pattern to have a second width that is smaller than the first width;

forming a plurality of spacers on sidewalls of the photoresist pattern having the second width, each spacer having a ring shape;

removing the photoresist film pattern;

etching the mask layer using the spacer as an etch mask to form a mask pattern; and etching the target etching layer using the mask pattern as an etch mask to form a target contact hole, wherein adjacent spacers contact each other in a first direction and a second direction perpendicular to the first direction, and the adjacent spacers are separated from each other by a designated distance in a third direction between the first direction and the second direction.

* * * * *